(12) United States Patent
Nakao et al.

(10) Patent No.: US 7,821,179 B2
(45) Date of Patent: Oct. 26, 2010

(54) ACOUSTIC WAVE RESONATOR

(75) Inventors: Takeshi Nakao, Omihachiman (JP);
Yasuharu Nakai, Takatsuki (JP);
Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/203,393

(22) Filed: Sep. 3, 2008

(65) Prior Publication Data
US 2008/0309192 A1 Dec. 18, 2008

Related U.S. Application Data

(63) Continuation of application No. PCT/JP2007/053058, filed on Feb. 20, 2007.

(30) Foreign Application Priority Data
Mar. 17, 2006 (JP) .............................. 2006-073853

(51) Int. Cl.
*H01L 41/08* (2006.01)
(52) U.S. Cl. ............................ 310/313 C; 310/313 R
(58) Field of Classification Search ............. 310/313 R, 310/313 C, 313 D
See application file for complete search history.

(56) References Cited

U.S. PATENT DOCUMENTS

| | | | | |
|---|---|---|---|---|
| 3,768,032 A | * | 10/1973 | Mitchell | 333/154 |
| 4,083,021 A | * | 4/1978 | Autran et al. | 333/194 |
| 4,684,907 A | | 8/1987 | Zibis | |
| 4,866,325 A | * | 9/1989 | Kodama et al. | 310/313 B |
| 4,910,426 A | * | 3/1990 | Watanabe et al. | 310/313 C |
| 5,204,575 A | | 4/1993 | Kanda et al. | |
| 5,561,408 A | * | 10/1996 | Yamamoto et al. | 333/194 |
| 5,621,364 A | * | 4/1997 | Ruile et al. | 333/195 |
| 5,767,603 A | * | 6/1998 | Kadota et al. | 310/313 B |
| 6,774,536 B2 | * | 8/2004 | Kachi et al. | 310/313 B |
| 6,791,236 B1 | * | 9/2004 | Abramov | 310/313 B |
| 7,482,896 B2 | * | 1/2009 | Wada et al. | 333/196 |
| 2001/0011932 A1 | | 8/2001 | Takamiya et al. | |
| 2001/0028286 A1 | | 10/2001 | Takamine | |
| 2004/0247153 A1 | | 12/2004 | Ruile et al. | |
| 2007/0008052 A1 | * | 1/2007 | Wada et al. | 333/196 |

FOREIGN PATENT DOCUMENTS

EP 1 744 451 A1 1/2007
JP 03-143112 A 6/1991

OTHER PUBLICATIONS

Official Communication issued in International Patent Application No. PCT/JP2007/053058, mailed on Jun. 5, 2007.
Official Communication issued in corresponding European Patent Application No. 07714561.3, mailed on Dec. 21, 2009.
Inoue et al., "Low-Loss SAW Filter on Li2B4O7 Using Novel-Shape Apodized Structure for 1 GHz RF-ID System", IEEE Ultrasonics Symposium, Sep. 18, 2005, pp. 1036-1041.

* cited by examiner

*Primary Examiner*—Mark Budd
(74) *Attorney, Agent, or Firm*—Keating & Bennett, LLP

(57) ABSTRACT

In an acoustic wave resonator, an IDT electrode is provided on a piezoelectric substrate. The IDT electrode is apodization-weighted such that a plurality of maximum values of cross widths are provided in acoustic wave propagation directions. Alternatively, in apodization weighting, weighting is applied such that at least one of a pair of envelopes located at outer side portions of the IDT electrode in directions substantially perpendicular to acoustic wave propagation directions includes a plurality of angled envelope portions angled from a central portion of the IDT electrode toward an outer side portion of the IDT electrode in a direction substantially perpendicular to the acoustic wave propagation directions.

20 Claims, 10 Drawing Sheets

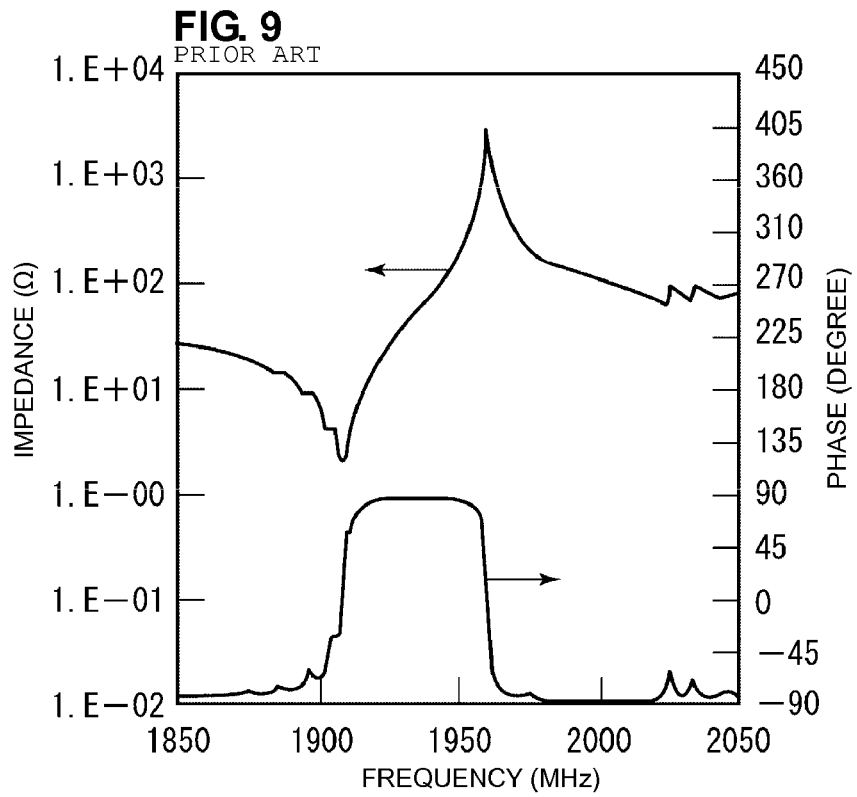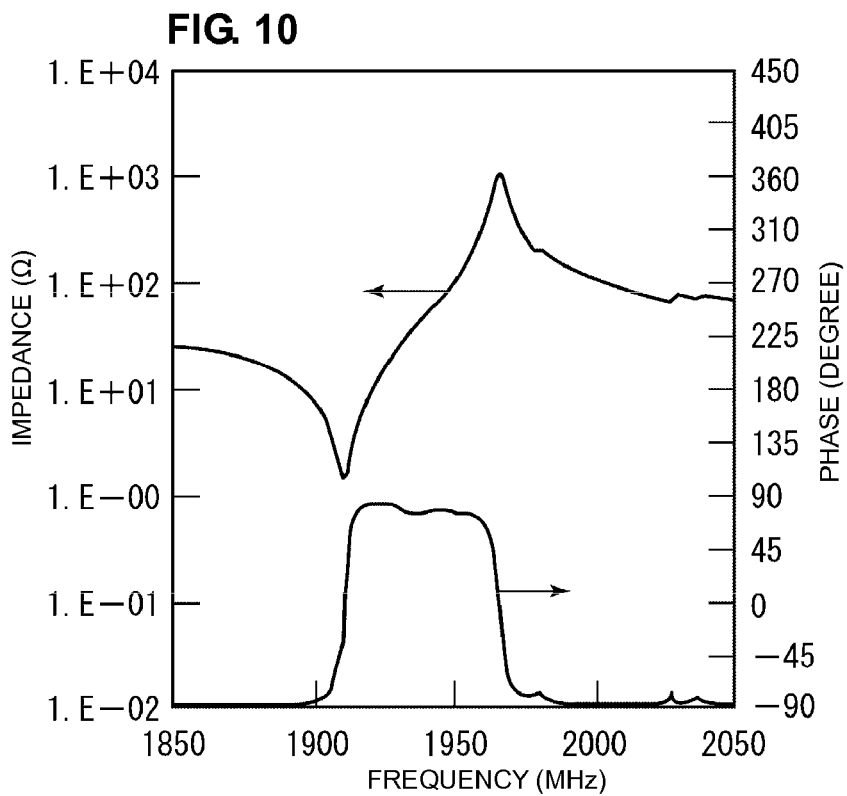

ACOUSTIC WAVE RESONATOR

BACKGROUND OF THE INVENTION

1. Field of the Invention

The present invention relates to acoustic wave resonators utilizing surface acoustic waves or boundary acoustic waves. More particularly, the present invention relates to a one-port acoustic wave resonator in which apodization weighting is applied to IDT electrodes.

2. Description of the Related Art

Various resonators utilizing surface acoustic waves and boundary acoustic waves have been disclosed in the past. For example, Japanese Patent No. 2645674 indicated below discloses a surface acoustic wave resonator illustrated in FIG. 16 and FIG. 17. A surface acoustic wave resonator 501 illustrated in FIG. 16 is a surface acoustic wave resonator utilizing Love waves described in Japanese Patent No. 2645674 as an example of the related art. In this surface acoustic wave resonator 501, an interdigital transducer (IDT) electrode 503 is provided on a piezoelectric substrate 502. The IDT electrode 503 is a normal IDT electrode. The surface acoustic wave resonator 501 utilizes resonance characteristics based on Love waves, and there is a problem in that spurious responses caused by transverse modes are generated.

To address this, Japanese Patent No. 2645674 discloses a one-port surface acoustic wave resonator 511 having an electrode structure illustrated in FIG. 17 which suppresses spurious responses caused by transverse modes. In the surface acoustic wave resonator 511, reflectors 513 and 514 are arranged at opposite sides of an IDT electrode 512 in surface acoustic wave propagation directions. As illustrated in the FIG. 17, apodization weighting is applied to the IDT electrode 512 such that the cross width is increased in a center portion in the surface acoustic wave propagation directions and is reduced toward the ends in the surface acoustic wave propagation directions.

In the surface acoustic wave resonator 511, apodization weighting is applied to the IDT electrode 512 as described above, and, accordingly, spurious responses caused by transverse modes are suppressed to achieve satisfactory resonance characteristics.

As described in Japanese Patent No. 2645674, in a one-port surface acoustic wave resonator utilizing Love waves, it is possible to suppress transverse-mode spurious responses by applying apodization weighting to an IDT electrode as described above. However, there is a problem with the apodization weighting described in Japanese Patent No. 2645674 in that the center portion of the IDT electrode 512 has a very large cross width. Specifically, since the apodization weighting is applied to the IDT electrode 512 illustrated in FIG. 17, the cross width of electrode fingers is very large at the center in the surface acoustic wave propagation directions, as compared to the IDT electrode 503 illustrated in FIG. 16, where the areas of the crossing portions of the IDT electrodes are substantially the same. That is, the IDT electrode 512 has a large maximum cross width, and thus, has long electrode fingers, which results in a concentration of power consumption at the center of the IDT electrode 513. This decrease the power resistance.

In addition, because of the large maximum cross width, the IDT electrode 513 must have a relatively large dimension in the direction perpendicular to the surface acoustic wave propagation directions.

Furthermore, the surface acoustic wave resonator 511 has another problem in that the Q factor at an anti-resonant frequency is not sufficiently high.

The surface acoustic wave resonator 511 described in above utilizes Love waves. Love waves and Rayleigh waves have relatively low acoustic velocities and are likely to be confined in an IDT, which may result in the generation of a transverse mode. When using acoustic waves, such as Love waves and Rayleigh waves, which have relatively low acoustic velocities and are not leaky waves, it is difficult to suppress a transverse mode causing spurious responses by adjusting the crystal orientation of a piezoelectric substrate.

SUMMARY OF THE INVENTION

To overcome the problems described above, preferred embodiments of the present invention provide a surface acoustic wave resonator which utilizes acoustic waves other than leaky acoustic waves, such as Love waves and Rayleigh waves, and is not vulnerable to the effects of spurious responses caused by a transverse mode and that is capable of increasing Q at an anti-resonant frequency and providing satisfactory resonance characteristics.

According to a preferred embodiment of the present invention, a one-port acoustic wave resonator is provided which includes a piezoelectric substrate and an IDT electrode provided on the piezoelectric substrate. In the acoustic wave resonator, apodization weighting is applied to the IDT electrode such that a plurality of maximum values of cross width are arranged in acoustic wave propagation directions.

According to another preferred embodiment of the present application, a one-port acoustic wave resonator is provided which includes a piezoelectric substrate and an IDT electrode provided on the piezoelectric substrate. In the acoustic wave resonator, apodization weighting is applied to the IDT electrode such that at least one of a pair of envelopes located at outer side portions in directions substantially perpendicular to acoustic wave propagation directions for the apodization weighting includes a plurality of angled envelope portions angled so as to extend from an approximate central portion toward an outer side portion of the IDT electrode in the directions substantially perpendicular to the acoustic wave propagation directions, as the angled envelope portions extend in one of the acoustic wave propagation directions.

An aspect ratio r expressed as a/b=r is preferably at least about 0.08, for example, where an area of a crossing region of the interdigital transducer is S and a normalized cross width of electrode fingers of the interdigital electrode 112 is a.

While the shape of the angled envelope portions is not specifically limited, in a preferred embodiment of the present invention, the angled envelope portions preferably have a substantially straight-line shape.

Alternatively, in another preferred embodiment of the present invention, the angled envelope portions preferably have a substantially curved shape.

According to another preferred embodiment of the present invention, a cross width at least one end of the IDT electrode in the acoustic wave propagation directions is about 50 percent or less of a maximum cross width.

According to another preferred embodiment of the present invention, a surface acoustic wave is used as the acoustic wave.

According to another preferred embodiment of the present invention, a surface acoustic wave other than a leaky surface acoustic wave in which transverse-mode spurious response is likely to be generated in a normal IDT, such as a Rayleigh wave or a Love wave, is preferably used as the surface acoustic wave.

In a surface acoustic wave resonator according to a preferred embodiment of the present invention, apodization weighting is applied to an IDT electrode such that a plurality of maximum values of cross width are provided in the surface acoustic wave propagation directions. Thus, loss caused by scattering and diffraction at electrode finger end portions can be reduced. This can increase a Q factor at an anti-resonant frequency. In addition, the maximum cross width of the IDT electrode can be reduced, i.e., the aspect ratio can be reduced, as compared to a surface acoustic wave resonator to which conventional apodization weighting is applied, when the area of the crossing region is substantially the same. This reduces the concentration of power at the center of the IDT electrode, and thus, increases power resistance.

Similarly, in another preferred embodiment of the present invention, an IDT electrode is apodization-weighted such that at least one of a pair of envelopes located at outer side portions in directions substantially perpendicular to acoustic wave propagation directions includes a plurality of angled envelope portions angled so as to extend from an approximate central portion toward an outer side portion of the IDT electrode in a direction substantially perpendicular to the acoustic wave propagation directions. Therefore, loss caused by scattering and diffraction at electrode finger end portions can be reduced and a Q factor at an anti-resonant frequency can be increased.

In addition, maximum cross width can be reduced, as compared to the case in which an IDT electrode to which conventional apodization weighting is applied is used, when the area of the cross width is substantially the same. Thus, power concentration at the central portion of a long electrode finger can be reduced, and thus, the power resistance can be increased.

Specifically, according to a preferred embodiment of the present invention, in a one-port acoustic wave resonator in which an IDT electrode is apodization-weighted, not only can ripple caused by a transverse mode, for example, be reduced, but also a Q factor at an anti-resonant frequency can be increased and the power resistance can be increased.

In preferred embodiments of the present invention, a Q factor at an anti-resonant frequency can be effectively increased when the aspect ratio r is at least about 0.08, for example. The upper limited of the aspect ratio r is determined by the chip size, and an excessively large aspect ratio is not desirable since the size of an acoustic wave resonator is increased. However, to increase the Q factor at the anti-resonant frequency, it is preferable to set the aspect ratio to at least about 0.08, for example, and, more preferably, to at least about 0.12, for example. In addition, the power resistance can be increased when portions to which apodization weighting is applied are consecutively arranged in acoustic wave propagation directions. Thus, when the aspect ratio is set to at least about 0.08, the power resistance is not substantially decreased. That is, when the aspect ratio is set to at least about 0.08, it is possible to increase the Q factor at the anti-resonant frequency without substantially reducing the power resistance.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 9 is a diagram illustrating resonance characteristics of a related-art surface acoustic wave resonator having an aspect ratio of about 0.25, to which apodization weighting is applied to provide a crossing region having one substantially complete rhombic shape.

FIG. 10 is a diagram illustrating resonance characteristic of the surface acoustic wave resonator of the first preferred embodiment in which the cross width at opposite ends in surface acoustic wave propagation directions is about 20 percent of the maximum cross width and of which the aspect ratio is about 0.06.

DETAILED DESCRIPTION OF PREFERRED EMBODIMENTS

Preferred embodiments of the present invention will be described in detail with reference to the drawings.

Figure 1A:
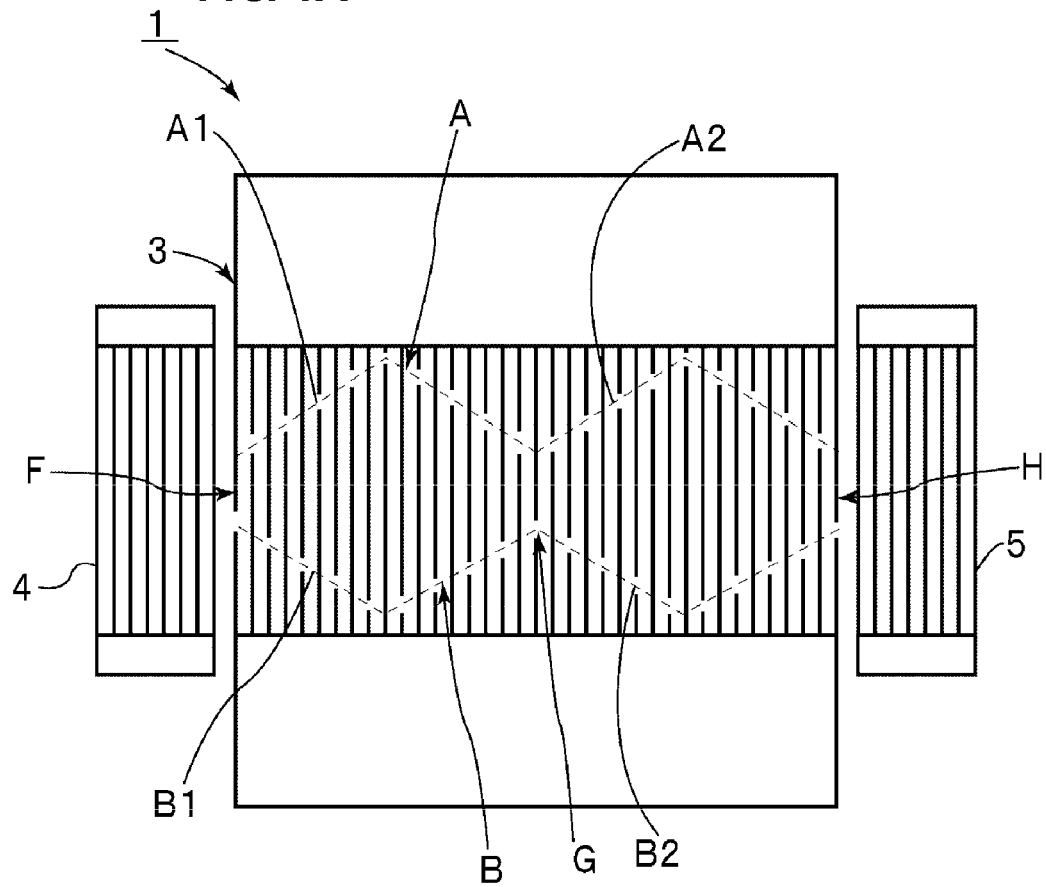
FIG. 1A is a schematic plan view illustrating electrode fingers of a surface acoustic wave resonator according to a first preferred embodiment of the present invention.
Figure 1B:
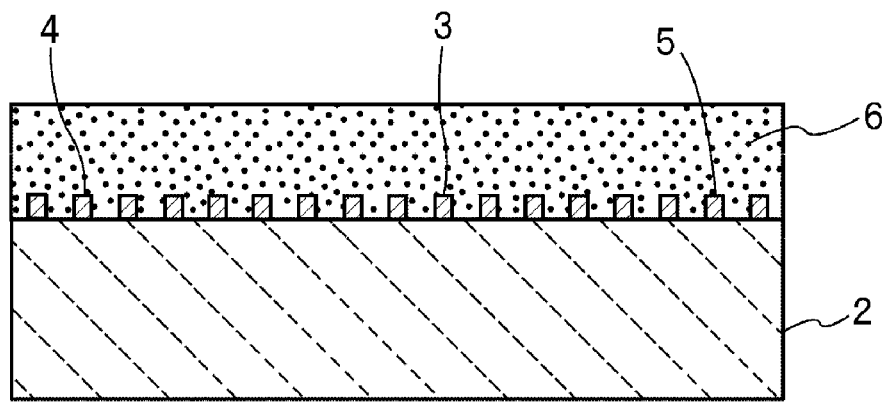
FIG. 1B is a schematic elevational cross-sectional view of the surface acoustic wave resonator.

FIG. 1A is a schematic plan view illustrating an electrode structure of a surface acoustic wave resonator according to a first preferred embodiment of the present invention and FIG. 1B is a schematic elevational cross-sectional view of the surface acoustic wave resonator shown in FIG. 1A. A surface acoustic wave resonator 1 includes a piezoelectric substrate 2. In the present preferred embodiment of the present invention, the piezoelectric substrate 2 is preferably made of a 126-degree Y-cut, X-propagating $LiNbO_3$ substrate, for example. Note that the piezoelectric substrate 2 may be made of a $LiNbO_3$ substrate having another crystal orientation or of another piezoelectric single crystal such as $LiTaO_3$. In addition, the piezoelectric substrate 2 may be made of piezoelectric ceramics. Further, the piezoelectric substrate 2 may have a structure in which a piezoelectric film is laminated on an insulating material.

An IDT electrode 3 is provided on the piezoelectric substrate 2. Reflectors 4 and 5 are provided at opposite sides of the IDT electrode 3 in the surface acoustic wave propagation directions.

As illustrated in FIG. 1A, the IDT electrode 3 includes a pair of comb-shaped electrodes and is apodization-weighted, such that a plurality of maximum values of cross width are present in the surface acoustic wave propagation directions. In other words, the IDT electrode 3 is apodization-weighted and includes a first envelope A and a second envelope B on outer side portions in directions substantially perpendicular to the surface acoustic wave propagation directions. Note that an envelope is a virtual line connecting the ends of a plurality of electrode fingers connected to one potential. In the present preferred embodiment, the envelopes A and B include angled envelope portions A1, A2, B1, and B2 which are angled so as to extend from a central portion of the IDT electrode 3 toward outer side portions of the IDT electrode 3 in the directions substantially perpendicular to the surface acoustic wave propagation directions, as they extend in one of the surface acoustic wave propagation directions. Specifically, in the angled envelope portion A1, the envelope A is angled from the central portion of the IDT electrode 3 to the outer side portion thereof in a direction substantially perpendicular to the surface acoustic wave propagation directions of the IDT electrode as it extends from an end portion of the IDT electrode 3 at the reflector 4 side toward the reflector 5 side. The angled envelope portion A2 is similarly arranged. Thus, the envelope A has a plurality of angled envelope portions.

In the present preferred embodiment of the present invention, the envelope B also includes a plurality of angled envelope portions B1 and B2.

In the surface acoustic wave resonator 1 according to the first preferred embodiment, a crossing region enclosed by the envelopes A and B includes two substantially rhombic regions. Note that as illustrated in FIG. 1A, two sides of each of the substantially rhombic regions are not fully brought into contact with each other at tips of the rhombuses, and apodization weighting is applied such that two of the substantially rhombic shapes are consecutively arranged. More specifically, at portions indicated by arrows F, G, and H in FIG. 1A, the cross width is not zero at the opposite ends of the substantially rhombic regions in the surface acoustic wave propagation directions and is about 20 percent of the maximum cross width. The cross width at the ends may be reduced to the extent that transverse-mode spurious responses can be reduced. Preferably, the cross width may be not greater than about 50 percent of the maximum cross width, for example, and more preferably, the cross width may be not greater than about 25 percent of the maximum cross width, for example.

In the reflectors 4 and 5, a plurality of electrode fingers extending in the directions substantially perpendicular to the surface acoustic wave propagation directions are short-circuited at both ends.

In the present preferred embodiment of the present invention, the IDT electrode 3 and the reflectors 4 and 5 are each preferably made of a Cu film having a thickness of about $0.05\lambda$ when the wavelength of a surface acoustic wave is $\lambda$, for example. Note that the IDT electrode 3 and the reflectors 4 and 5 may be formed of another metal such as Al and Ag or an alloy, for example. In addition, the IDT electrode 3 and the reflectors 4 and 5 may be made of a multilayer metal film including a laminate of a plurality of metal films, for example.

In the present preferred embodiment of the present invention, an insulating film 6 to improve temperature characteristics is laminated so as to cover the IDT electrode 3. In the present preferred embodiment, the insulating film 6 is preferably made of an $SiO_2$ film having a thickness of about $0.27\lambda$, for example. The $SiO_2$ film has a positive frequency temperature coefficient, while the $LiNbO_3$ substrate has a negative frequency temperature coefficient. Thus, by laminating the insulating film 6 made of an $SiO_2$ film, a temperature change caused by the frequency of the surface acoustic wave resonator 1 can be minimized, and the temperature characteristics are improved.

Note that the insulating film 6 to improve temperature characteristics may not necessarily be provided. In addition, the insulating film 6 to improve temperature characteristics may be made of an insulating material other than $SiO_2$.

In the surface acoustic wave resonator 1 of the present preferred embodiment of the present invention, the IDT electrode 3 is apodization weighted as described above. This increases the Q factor at an anti-resonant frequency and also increases the power resistance. In addition, the degree of freedom in designing the surface acoustic wave resonator 1 can be increased. This will be described in more detail below.

As illustrated in FIG. 1A, the IDT electrode 3 is apodization-weighted such that the crossing region enclosed by the envelopes A and B has the shape of two substantially rhombic regions arranged in the surface acoustic wave propagation directions. Thus, the maximum value of the cross width is provided in two portions of the IDT electrode 3 in the surface acoustic wave propagation directions. In other words, in at least one of the envelopes A and B, the angled envelope portions A1 and A2 or B1 and B2 are provided in two portions of the IDT electrode 3, respectively.

This weighting improves the Q factor at an anti-resonant frequency, for the following reasons.

A surface acoustic wave is scattered and diffracted by another surface wave or bulk wave at a leading end of an electrode finger or in a gap at the outside of the leading end, which results in loss. Thus, the Q factor at an anti-resonant frequency may be deteriorated for this reason. On the other hand, in the present preferred embodiment of the present invention, this loss is suppressed since the envelopes A and B described above have a plurality of angled envelope portions A1, A2, B1 and B2. It is considered that this reduces the diffraction loss, and thus, the Q factor at an anti-resonant frequency is increased.

Figure 4A:
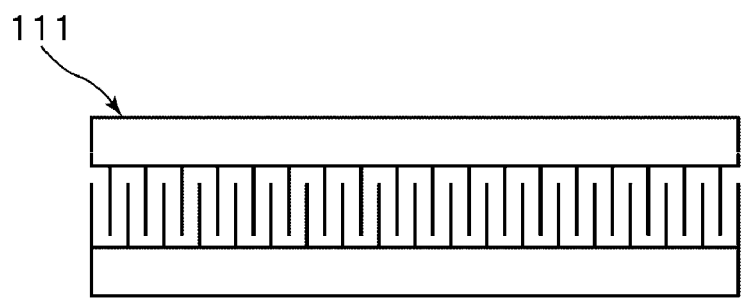
FIG. 4A is a plan view schematically illustrating a normal IDT electrode.
Figure 4B:
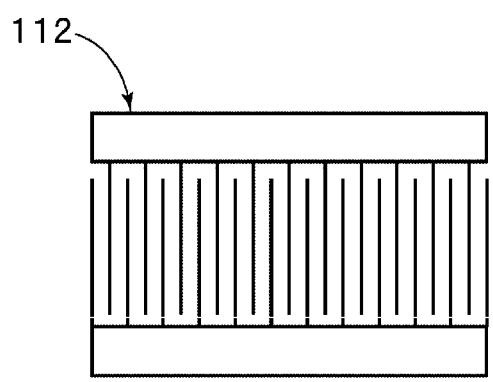
FIG. 4B is a schematic plan view illustrating a normal IDT electrode obtained by increasing the aspect ratio of the IDT electrode illustrated in FIG. 4A.
Figure 4C:
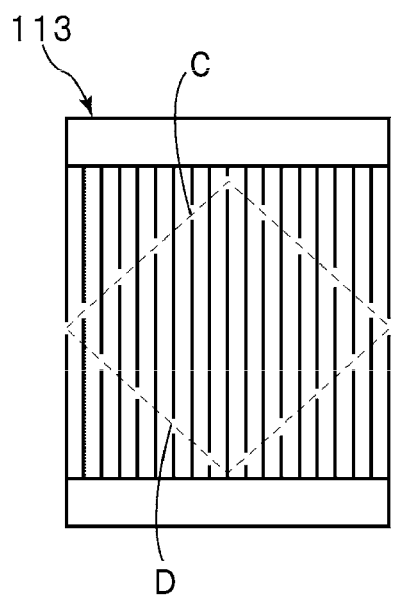
FIG. 4C is a schematic plan view illustrating a conventional IDT electrode to which apodization weighting is applied for improving transverse-mode ripple in the IDT electrode illustrated in FIG. 4B

This will be more specifically described with reference to FIGS. 4A to 4C as examples. In order to increase an anti-resonant frequency Q-factor when an IDT electrode 111 has an aspect ratio of about 0.06 and a cross width of about 10λ, an IDT electrode 112 having a cross width of about 20 and an aspect ratio of about 0.25 may be provided, as illustrated in FIG. 4B. Then, in order to suppress transverse-mode spurious responses, weighting is applied to the IDT electrode such that the crossing region is enclosed by envelopes having substantially rhombic shapes, as illustrated in FIG. 4C. At this time, when the aspect ratio of about 0.25 is not changed, the IDT electrode has a very large cross width of about 40λ. Although this improves the anti-resonant Q factor, the cross width is very large, which significantly decreases the degree of freedom in design and decreases the power resistance.

On the other hand, in the preferred embodiment described above, in order to suppress transverse-mode spurious responses while having the same area S of a crossing area as the IDT electrode 112, weighting is applied such that a crossing region including two substantially rhombic portions is provided. This not only increases the anti-resonant frequency Q and reduces the transverse-mode spurious responses but also reduces the aspect ratio and enhances the power resistance. Since the aspect ratio is reduced, the size of a chip in the directions substantially perpendicular to the surface acoustic wave propagation directions can be reduced, which also increases the degree of design freedom.

Now, the meaning of an aspect ratio r will be described with reference to FIGS. 4A to 4C. The aspect ratio is expressed as (normalized cross width)/(number of pairs). The normalized cross width refers to a (=L/λ), in which a cross width L is normalized by a wavelength λ of a surface wave. As illustrated in FIG. 4A, the normal IDT electrode 111, to which apodization weighting is not applied, has a constant cross width. Thus, the aspect ratio r=(cross width)/(number of pairs) can be immediately obtained when the cross width and the number of pairs of electrode fingers are provided. On the other hand, in an IDT electrode 113 in which apodization weighting is applied, the cross width is changed along the surface acoustic wave propagation directions. Specifically, in the IDT electrode 113, the cross width is greatest at the approximate center of the IDT electrode 113 and this cross width is the maximum cross width. The cross width decreases from the approximate center towards the outer side portions of the IDT electrode 113 in the surface acoustic wave propagation directions. Therefore, it is not possible to immediately obtain the aspect ratio r which is calculated as (cross width)/(number of pairs).

Thus, in the IDT electrode 113, when the area of the crossing region of the IDT electrode 113 is set as S, the equivalent normal IDT electrode 112 having the same area of the crossing region and the same number of pairs of electrode fingers is assumed. In other words, the area S of the crossing region of the IDT electrode 113, i.e., the area of the portion enclosed by envelopes C and D, is set as S. The area of the crossing region in the IDT electrode 112 is also S. The numbers of electrode fingers of the IDT electrode 112 and the IDT electrode 113 are both b. Therefore, when a normalized cross width of the electrode fingers of the IDT electrode 112 is a, the aspect ratio r of the IDT electrode 112 is expressed as a/b, and it is assumed that the IDT electrode 113 has an aspect ratio that is expressed as a/b=r.

That is, the aspect ratio of the normal IDT electrode 112 of which the area S of the crossing region is the same as that of the IDT electrode 113 is set as the aspect ratio r of the IDT electrode 113. In this manner, the aspect ratio of the normal IDT electrode 112 having the same area S of crossing portion and the same number of pairs of electrode fingers is used as the aspect ratio of the IDT electrode 113. This is because the cross width of the IDT electrode 113 changes along the surface acoustic wave propagation directions and is not constant, as described above.

Figure 5:
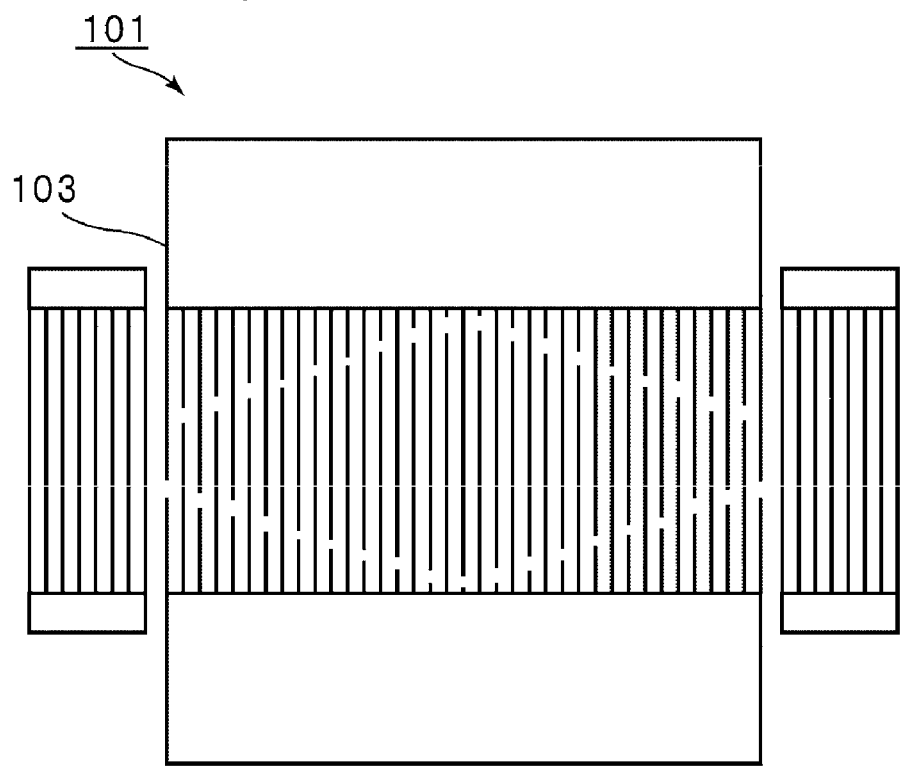
FIG. 5 is a schematic plan view illustrating an electrode structure of a conventional surface acoustic wave resonator prepared for comparison with the first preferred embodiment.

Now, as illustrated in FIG. 5, a conventional surface acoustic wave resonator 101 is prepared as a comparative example of a surface acoustic wave resonator. The surface acoustic wave resonator is configured similarly to the surface acoustic wave resonator 1 according to the preferred embodiment of the present invention described above, except that an IDT electrode 103 is apodization-weighted so that the crossing region includes one substantially rhombic shape.

Then, the aspect ratios of the surface acoustic wave resonator of the comparative example and the surface acoustic wave resonator of the first preferred embodiment were changed and corresponding Q factors at anti-resonant frequencies were measured.

Figure 6:
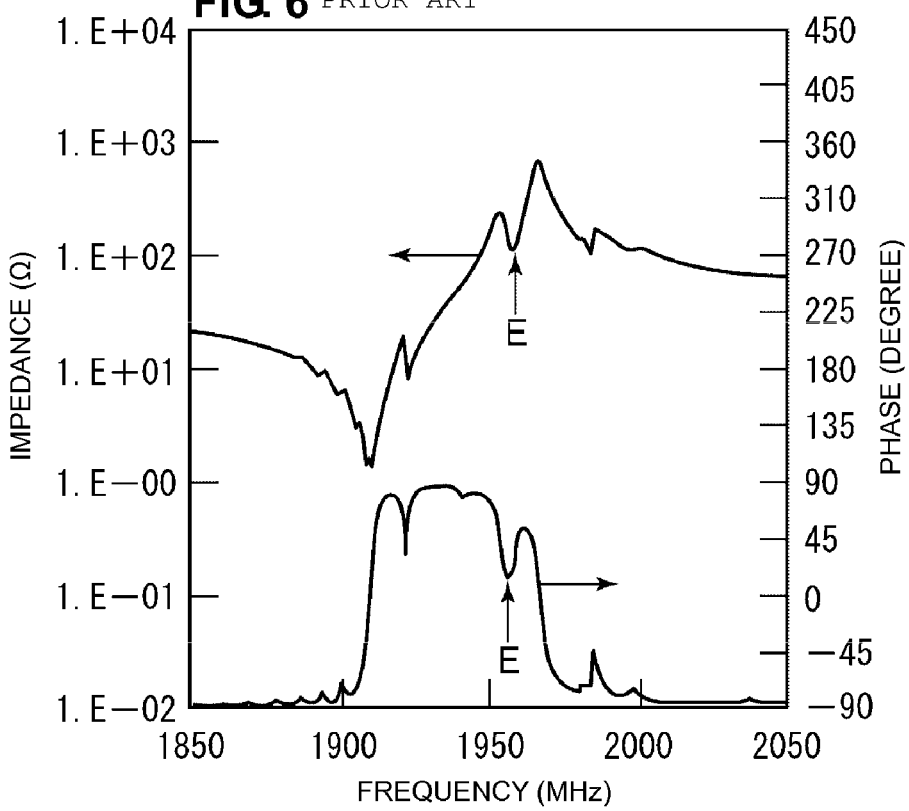
FIG. 6 is a diagram illustrating resonance characteristics of a surface acoustic wave resonator having a normal IDT electrode.
Figure 7:
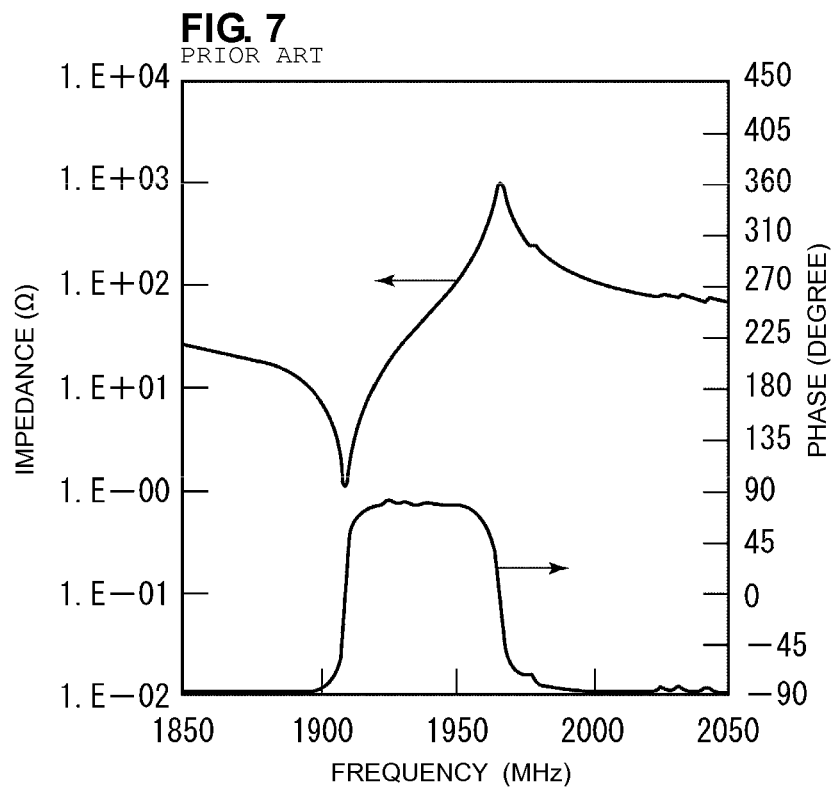
FIG. 7 is a diagram illustrating resonance characteristics of a related-art surface acoustic wave resonator having an aspect ratio of about 0.06, to which apodization weighting is applied to provide a crossing region having one substantially complete rhombic shape.
Figure 8:
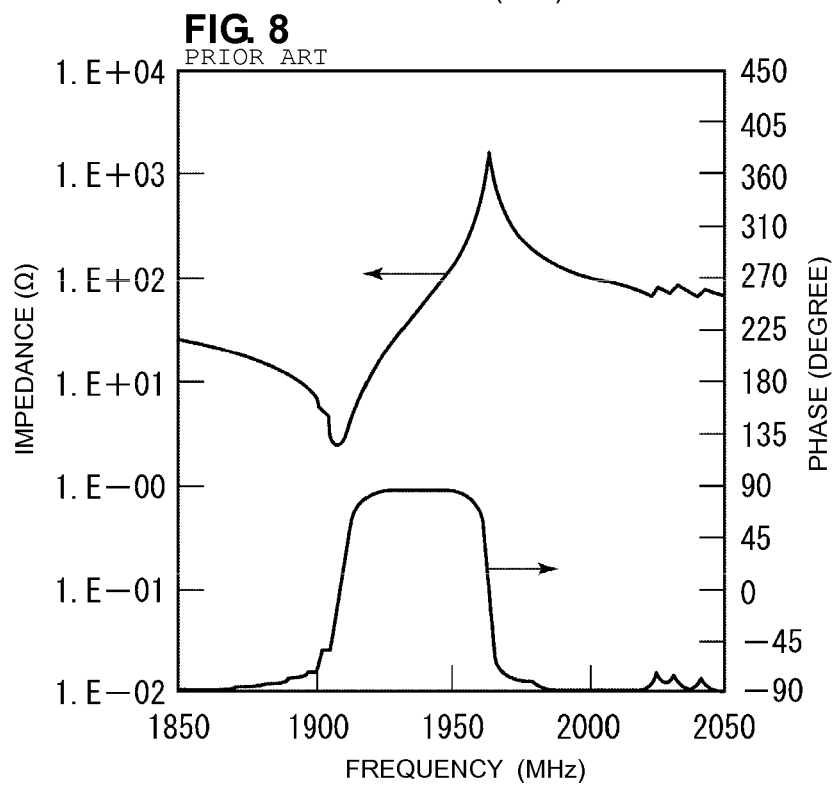
FIG. 8 is a diagram illustrating resonance characteristics of a related-art surface acoustic wave resonator having an aspect ratio of about 0.14, to which apodization weighting is applied to provide a crossing region having one substantially complete rhombic shape.

FIG. 6 to FIG. 12 illustrate resonance characteristics obtained by changing the aspect ratios of a surface acoustic wave resonator having a normal IDT electrode, the surface acoustic wave resonator 101 of the comparative example described above, and the surface acoustic wave resonator 1 according to the first preferred embodiment of the present invention. FIG. 6 illustrates resonance characteristics of the surface acoustic wave resonator using the normal IDT electrode having the same area S of the crossing region and the same number of pairs of electrode fingers as the surface acoustic wave resonator according the first preferred embodiment. FIG. 7 to FIG. 9 illustrate resonance characteristics of the surface acoustic wave resonator 101 of the related-art example prepared for comparison, with its aspect ratio r set to about 0.06, about 0.14, and about 0.25, respectively.

Figure 11:
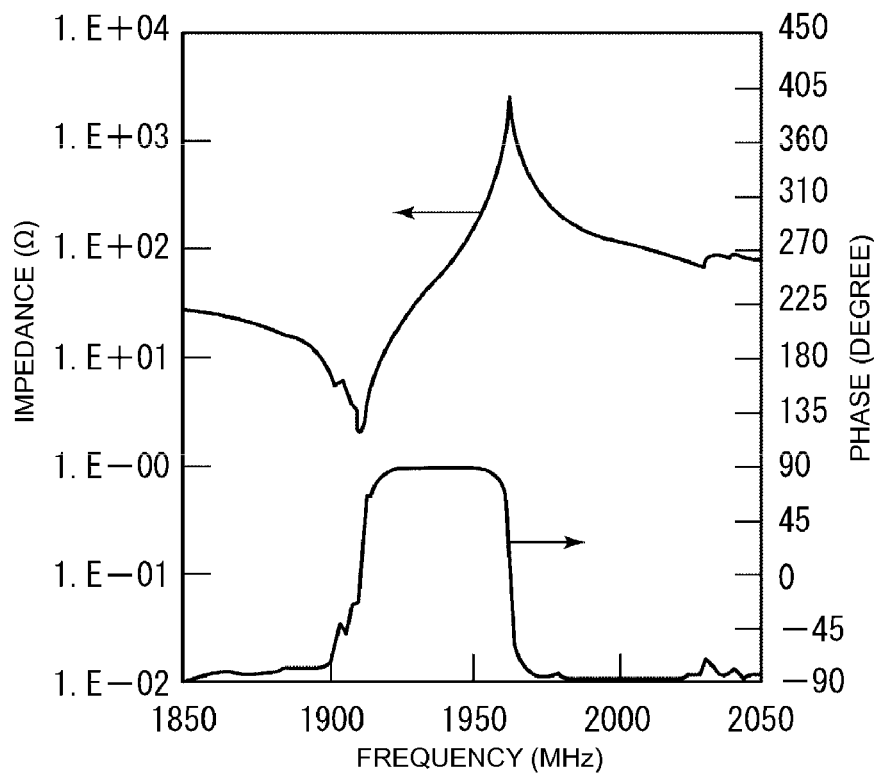
FIG. 11 is a diagram illustrating resonance characteristic of the surface acoustic wave resonator of the first preferred embodiment in which the cross width at opposite ends in surface acoustic wave propagation directions is about 20 percent of the maximum cross width and of which the aspect ratio is about 0.14.
Figure 12:
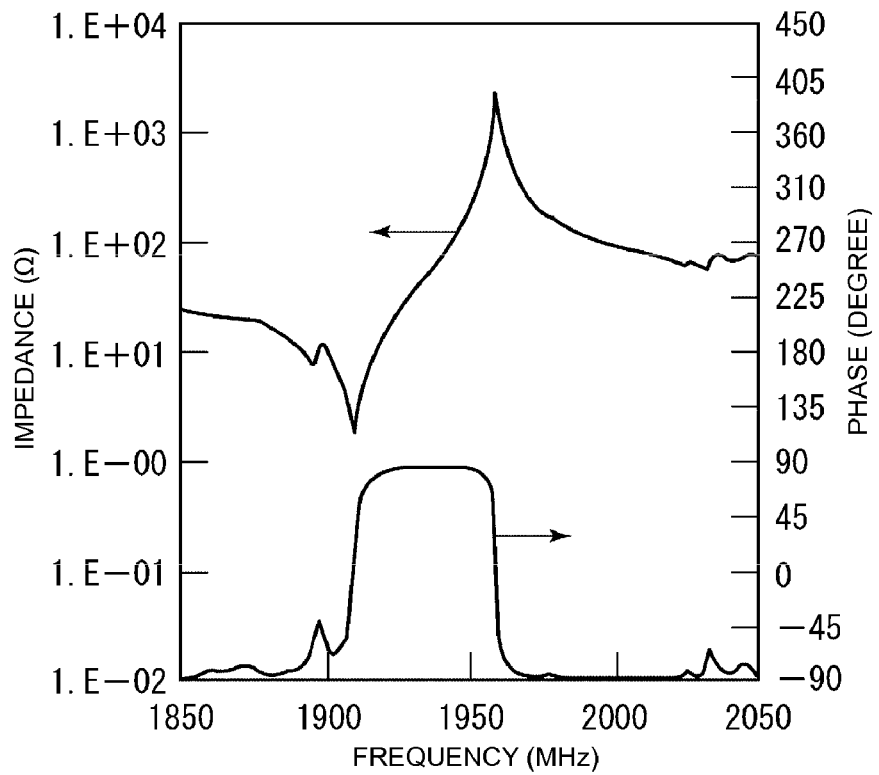
FIG. 12 is a diagram illustrating resonance characteristic of the surface acoustic wave resonator of the first preferred embodiment in which the cross width at opposite ends in surface acoustic wave propagation directions is about 20 percent of the maximum cross width and of which the aspect ratio is about 0.25.

FIG. 10 to FIG. 12 illustrate resonance characteristics of the surface acoustic wave resonator according to the first preferred embodiment, with its aspect ratio r set to about 0.06, about 0.14, and about 0.25, respectively.

As illustrated in FIG. 6, in the surface acoustic wave resonator having the normal IDT electrode, large a spurious response caused by a transverse mode is produced between a resonant frequency and an anti-resonant frequency, as indicated by an arrow E.

On the other hand, as illustrate in FIG. 7 to FIG. 12, in each of the surface acoustic wave resonator of the related-art example and the surface acoustic wave resonator according to the first preferred embodiment, it can be seen that a spurious response present between the resonant frequency and the anti-resonant frequency is suppressed. In addition, as is apparent from comparison between FIG. 7 to FIG. 9 and FIG. 10 and FIG. 12 respectively, in the surface acoustic wave resonator according to the first preferred embodiment, the peak of the anti-resonant frequency is steep and the Q factor in the anti-resonant frequency is increased as compared to the surface acoustic wave resonator of the related-art example, where these surface acoustic wave resonator have the same aspect ratio. That is, according to the surface acoustic wave resonator 1 of the first preferred embodiment of the present invention, the Q factor at the anti-resonant frequency can increased as compared to the related-art example, when the aspect ratios thereof are the same. For example, the resonance characteristic illustrated in FIG. 9 corresponds to the aspect ratio of about 0.25 in the related-art example. The resonance characteristic near the anti-resonant frequency is substantially the same as the resonance characteristic of the surface acoustic wave resonator according to the first preferred embodiment with the aspect ratio of about 0.14 illustrated in FIG. 11.

Figure 2:
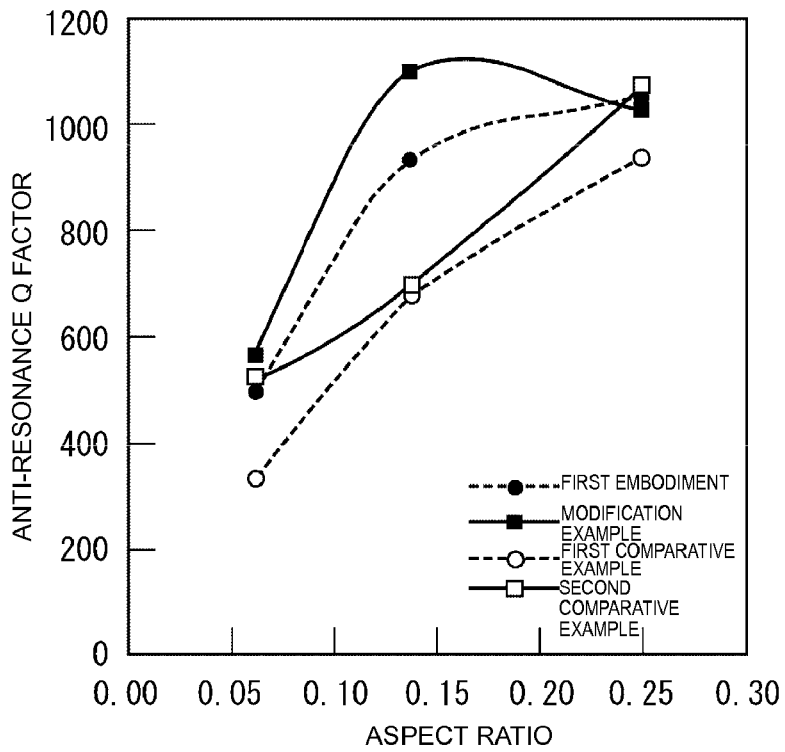
FIG. 2 is a diagram illustrating the relationship between the aspect ratio and the Q factor at an anti-resonant frequency, in surface acoustic wave resonators according to the first preferred embodiment and a modified example, and surface acoustic wave resonators of a first comparative example and a second comparative example.

FIG. 2 illustrates the relationship between the aspect ratio and the Q factor at the anti-resonant frequency. FIG. 2 shows the results corresponding to the first preferred embodiment of the present invention, an example of a modification of the first preferred embodiment described below, the surface acoustic wave resonator 101 of the first comparative example illustrated in FIG. 5, and a surface acoustic wave resonator of the second comparative example which is a modification example of the surface acoustic wave resonator 101. As is apparent from a comparison between the results corresponding to the first preferred embodiment and the surface acoustic wave resonator of the first comparative example illustrated in FIG. 2, according to the first preferred embodiment, compared to the equivalent surface acoustic wave resonator of the first comparative example, the Q factor at the anti-resonant frequency can be increased regardless of the aspect ratio. In addition, as shown in FIG. 2, the Q factor at the anti-resonant frequency increases with increasing aspect ratio in the surface acoustic wave resonator according to the first preferred embodiment.

Thus, according to the first preferred embodiment of the present invention, the Q factor at the anti-resonant frequency can be increased as compared to the related-art surface acoustic wave resonator 101, if the same aspect ratio is used. Thus, according to the first preferred embodiment, the aspect ratio can be reduced while having substantially the same Q factor at an anti-resonant frequency as the conventional surface acoustic wave resonator 101. For example, it can be seen from FIG. 2 that to set the Q factor at the anti-resonant frequency to about 1000, the aspect ratio of the conventional surface acoustic wave resonator is about 0.25, while the aspect ratio can be as small as about 0.15 according to the first preferred embodiment of the present invention, indicating that the cross width can be reduced by about 20 percent. Accordingly, since the aspect ratio r can be reduced, the length of the longest electrode finger can be reduced, which increases the power resistance.

Figure 3:
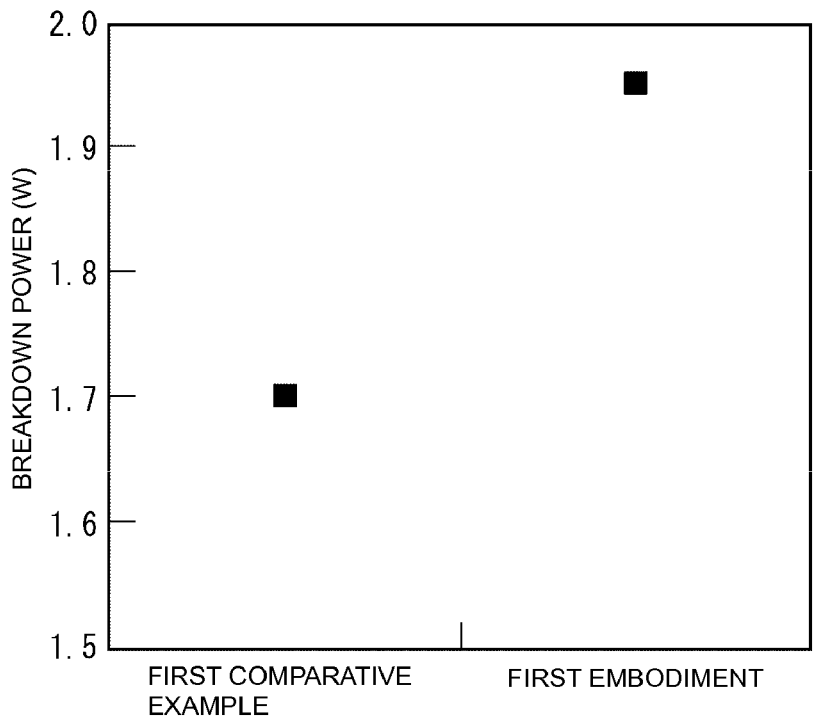
FIG. 3 is a diagram illustrating power resistance of surface acoustic wave resonators of the first preferred embodiment and a related-art example.

FIG. 3 is a diagram illustrating the breakdown power of the surface acoustic wave resonator according to the first preferred embodiment and that of the conventional surface acoustic wave resonator prepared as the first comparative example. The breakdown power (W) was obtained by measuring the breakdown power of ladder filters including a plurality of surface acoustic wave resonators 1 and 101, in the following manner. Each of the surface acoustic wave resonators 1 and the surface acoustic wave resonators 101 was used as a parallel arm resonator of a ladder filter having three series arm resonators and two parallel arm resonators. The other resonators were formed using conventional substantially rhombic-weighted resonators.

Then, power was applied to the input of each of the ladder filters obtained as described above, and the power at which IDT electrodes of the parallel arm resonators were broken was set as the breakdown power.

As shown in FIG. 3, according to the first preferred embodiment, compared to the equivalent related-art surface acoustic wave resonator 101, the breakdown power can be increased from about 1.7 W to about 1.95 W, indicating that the power resistance can be increased by about 15 percent.

The power resistance can be increased because the maximum cross width can be decrease when the area S of a crossing region is substantially the same. Specifically, when the area S of the crossing region of the surface acoustic wave resonator 1 is substantially equal to the area S of the crossing region of the surface acoustic wave resonator 101, the maximum cross width of the surface acoustic wave resonator 1, i.e., the cross width of a portion at which the longest electrode finger is located, is less than the maximum cross width at the approximate center of the surface acoustic wave resonator illustrated in FIG. 5. On the other hand, applied power is concentrated on the approximate center of the longest electrode finger, i.e., the approximate center of the electrode finger having the maximum cross width. Thus, in the surface acoustic wave resonator 101, since the length of the longest electrode finger is large, breakdown is likely to occur due to the power concentration.

On the other hand, in the surface acoustic wave resonator 1 of the first preferred embodiment, not only is the length of the longest electrode finger reduced, but the longest electrode fingers are also disposed at two portions in accordance with apodization weighting that includes two substantially rhombic portions, and thus the concentration of power consumption is reduced. Therefore, breakdown of electrode fingers is not likely to occur, and the power resistance is effectively increased.

The inventor of the present invention discovered that even when apodization weighting is applied such that crossing regions enclosed by two substantially rhombic-shaped portions are provided, spurious responses caused by transverse modes minimized, as shown in FIG. 11 and FIG. 12.

Figure 13:
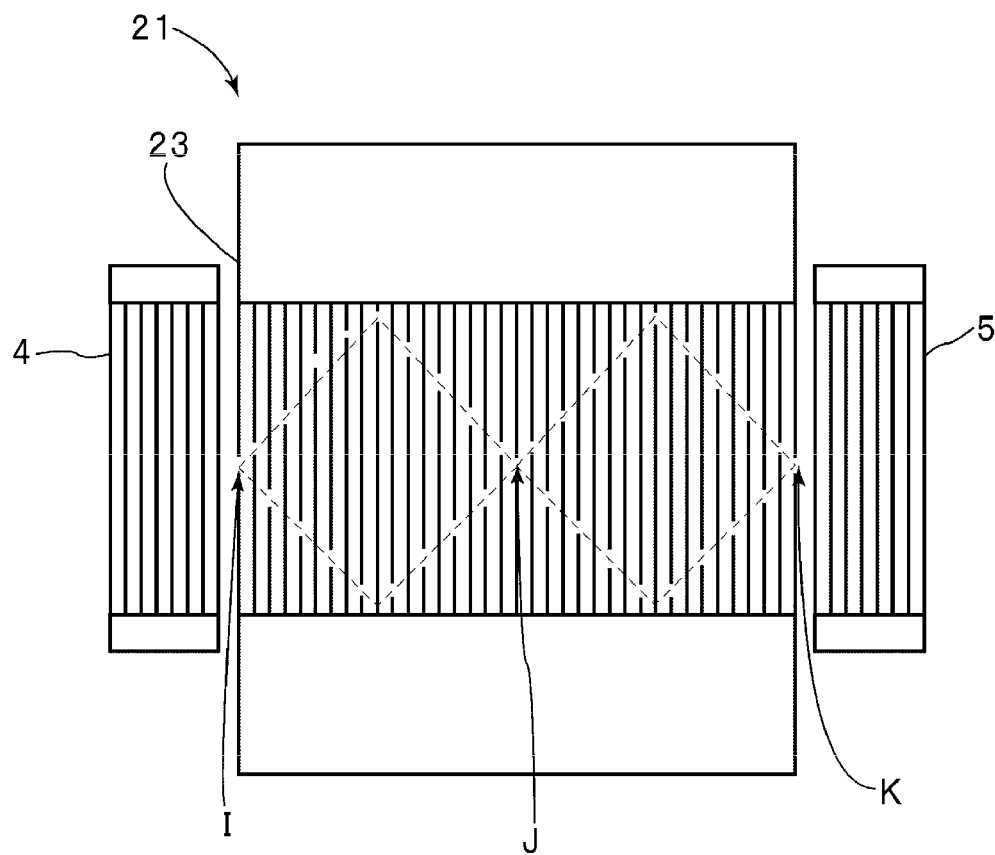
FIG. 13 is a schematic plan view illustrating an example of a modification of the first preferred embodiment in which apodization weighting is applied such that two rhombic crossing regions having complete rhombic shapes and the cross width at the ends in surface acoustic wave propagation directions is zero.

FIG. 13 is a schematic plan view illustrating an electrode structure of a surface acoustic wave resonator according to an example of a modification of the first preferred embodiment of the present invention.

In a surface acoustic wave resonator 21 of the modified example illustrated in FIG. 13, an IDT electrode 23 is substantially similar to the surface acoustic wave resonator 1 in that two substantially rhombic-shaped crossing regions are arranged in the surface acoustic wave propagation directions. However, in this surface acoustic wave resonator 21, the cross width at the opposite ends of the individual two substantially rhombic-shaped regions in the surface acoustic wave propagation directions is substantially zero. Specifically, the cross width at portions indicated by arrows I, J, and K is substantially zero. In this manner, when a plurality of substantially rhombic-shaped crossing regions are consecutively arranged in the surface acoustic wave propagation directions, the cross width at opposite ends in the surface acoustic wave propagation directions may be set to approximately zero.

FIG. 2 also illustrates the relationship between the aspect ratio and the Q factor at an anti-resonant frequency of the surface acoustic wave resonator 21 of the modified example which is configured similarly to the first preferred embodiment except that the weighting is applied as described above. For comparison, a surface acoustic wave resonator having one substantially rhombic-shaped crossing region and having a cross width at the opposite ends in the surface acoustic wave propagation directions of substantially zero was also prepared. Specifically, a surface acoustic wave resonator of the second comparative example to which apodization weighting is applied so that a substantially complete rhombus shape is provided was prepared, and the aspect ratio and the Q factor at the anti-resonant frequency were measured. The result of the measurement is also indicated in FIG. 2.

As shown in FIG. 2, with a surface acoustic wave resonator having a substantially rhombic-shaped crossing region, even when weighting is applied so that the cross width is substantially zero at the opposite ends in the surface acoustic wave propagation directions, the Q factor at the anti-resonant frequency can be effectively increased by arranging a plurality of crossing regions in the surface acoustic wave propagation directions.

In addition, as is apparent from a comparison between the result of the first preferred embodiment and that of the modified example described above, by setting the cross width of the crossing region to approximately zero at opposite ends in the surface acoustic wave propagation directions, i.e., setting the crossing region to have a substantially complete rhombus shape, as in the case of the modified example described above, the Q factor at the anti-resonant frequency can be further increased as compared to the first preferred embodiment of the present invention.

Furthermore, as shown in FIG. 2, by setting the aspect ratio to at least about 0.08 in either the first preferred embodiment or the modified example described above, the Q factor at the anti-resonant frequency can be effectively increased as compared to the related-art example having the same aspect ratio. Therefore, the aspect ratio r is preferably set to be at least about 0.08. It is more preferable that the aspect ratio is set to at least about 0.12. This makes it possible to achieve a Q factor which cannot be provided by an equivalent related-art example. Thus, more preferably, the aspect ratio is set to at least about 0.12.

Figure 14:
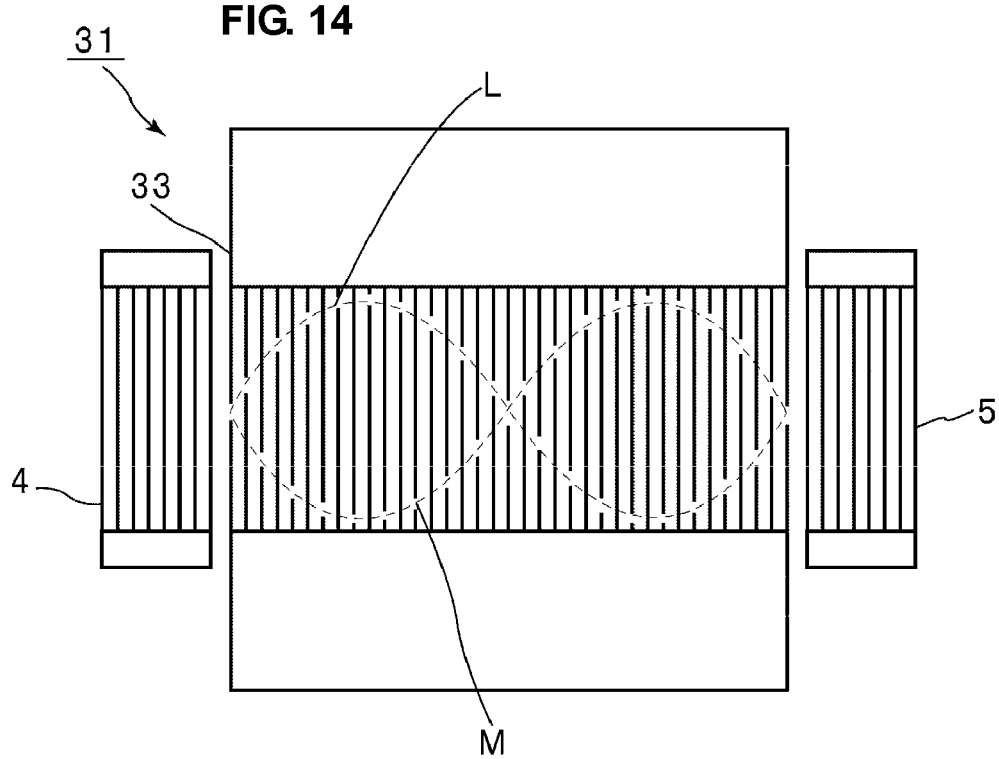
FIG. 14 is a schematic plan view illustrating another example of an IDT electrode of a surface acoustic wave resonator according to a preferred embodiment of the present invention.

In the first preferred embodiment and the modified example, each of the envelopes A and B has the shape including substantially straight lines, and thus a plurality of substantially rhombic-shaped crossing regions are provided in surface acoustic wave propagation directions. However, the envelopes may also be a substantially curved shape, for example. In a surface acoustic wave resonator 31 which is another modified example illustrated in FIG. 14, an IDT electrode 33 is apodization-weighted so as to have substantially cosine-curve-shaped envelopes L and M. Also in this case, two crossing regions enclosed by the envelopes L and M are arranged along the surface acoustic wave propagation directions.

Figure 15:
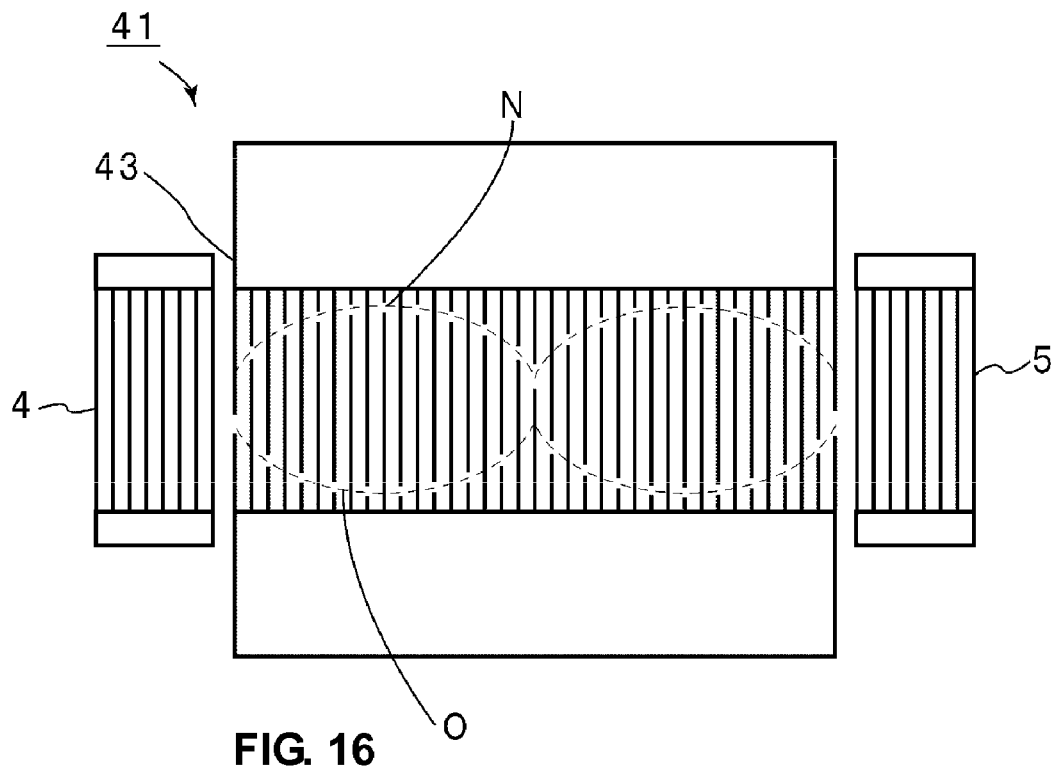
FIG. 15 is a schematic plan view illustrating another example of an IDT electrode of a surface acoustic wave resonator according to a preferred embodiment of the present invention.
Figure 16:
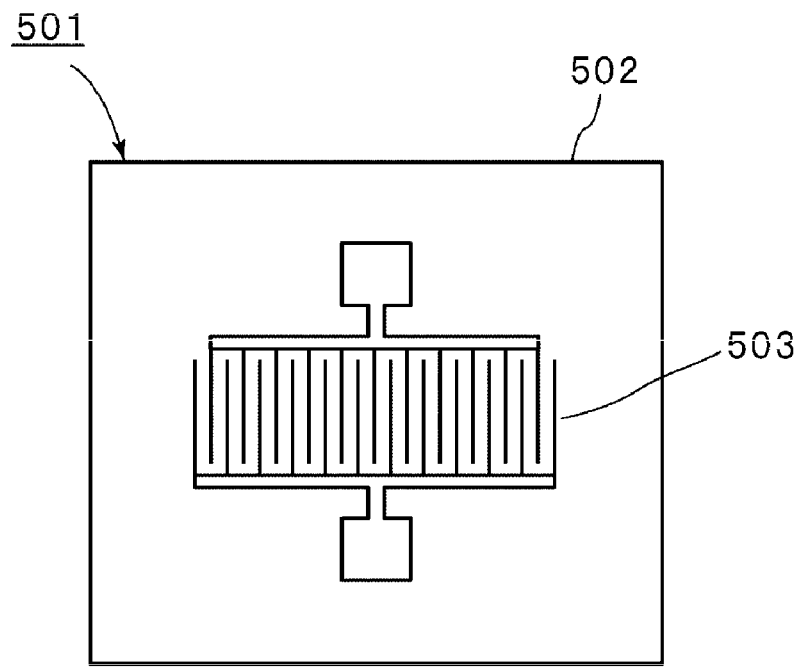
FIG. 16 is a schematic plan view illustrating an example of an electrode structure of a related-art surface acoustic wave resonator.
Figure 17:
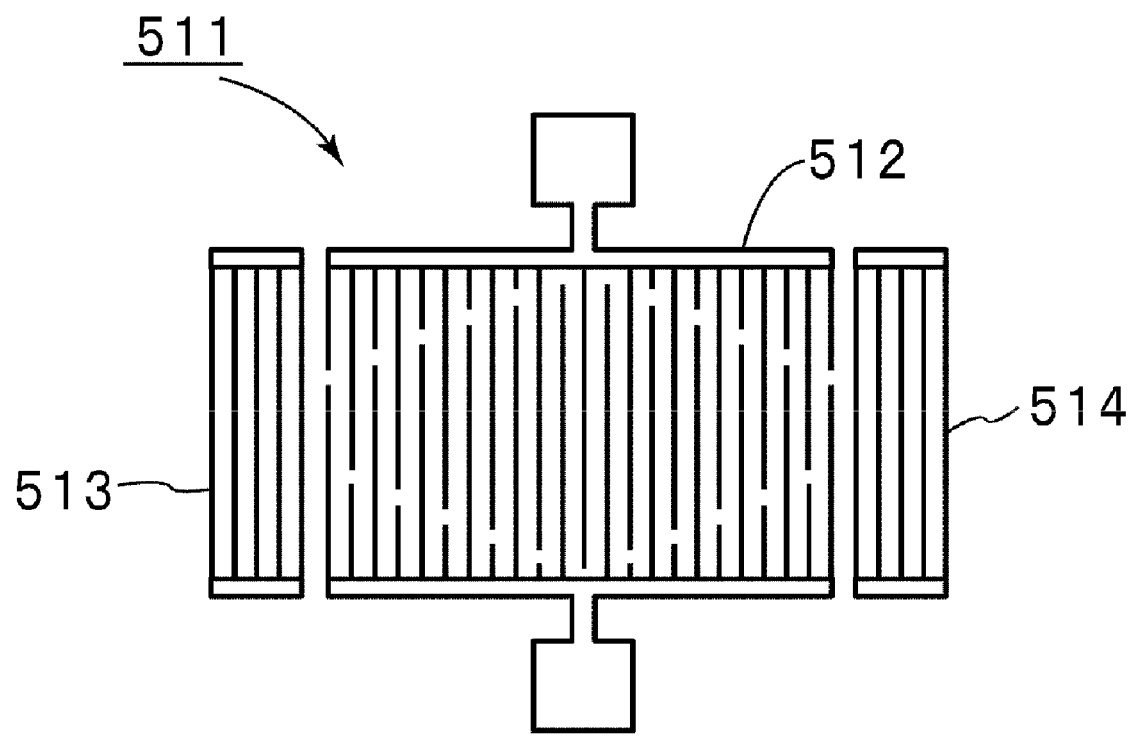
FIG. 17 is a schematic plan view illustrating another example of an electrode structure of a related-art surface acoustic wave resonator.

Moreover, in a surface acoustic wave resonator 41 illustrated in FIG. 15, in apodization weighting applied to an IDT electrode 43, each of envelopes N and O has a substantially curved shape so that two crossing regions arranged in the surface acoustic wave propagation directions have substantially oval shapes, for example.

In this manner, in preferred embodiments of the present invention, in apodization weighting applied to an IDT electrode, an envelope may have the shape including substantially straight-lines or a substantially curved shape, for example.

In addition, in each of the first preferred embodiment and the modified examples, a surface acoustic wave resonator utilizing Rayleigh waves is described. However, the surface acoustic wave resonator according to preferred embodiments of the present invention may utilize another type of non-leaky waves such as Love waves, for example. In addition, the surface acoustic wave resonator may be a one-port surface acoustic wave resonator utilizing not only surface acoustic waves but also boundary acoustic waves, for example.

Note that in preferred embodiments of the present invention, the shape of an angled envelope portions and the planar shape of a crossing region are not limited to any specific shape, as long as apodization weighting is applied such that a plurality of maximum values of the cross width are provided in surface acoustic wave propagation directions, or as long as at least one of a pair of envelopes includes a plurality of angled envelope portions angled from the central region toward outer side portions of the IDT electrode in the directions substantially perpendicular to the surface acoustic wave propagation directions.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave resonator comprising:
a piezoelectric substrate; and
an interdigital transducer electrode provided on the piezoelectric substrate; wherein
the interdigital transducer electrode is apodization weighted such that a plurality of maximum values of cross width are provided in acoustic wave propagation directions; and
an aspect ratio r expressed as a/b=r is at least 0.08, where a number of electrodes fingers of the interdigital transducer electrode is b and a normalized cross width of the electrode fingers of the interdigital transducer electrode is a.

2. An acoustic wave resonator comprising:
a piezoelectric substrate; and
an interdigital transducer electrode provided on the piezoelectric substrate;
wherein
the interdigital transducer electrode is apodization weighted such that a plurality of maximum values of cross width are provided in acoustic wave propagation directions; and
a cross width at least one end portion of the interdigital transducer electrode in the acoustic wave propagation directions is not more than about 50 percent of a maximum cross width.

3. The acoustic wave resonator according to claim 1, wherein a surface acoustic wave is used as the acoustic wave.

4. The acoustic wave resonator according to claim 3, wherein one of a Rayleigh wave and a Love wave is used as the surface acoustic wave.

5. The acoustic wave resonator according to claim 1, wherein the acoustic wave resonator is a one-port acoustic wave resonator.

6. An acoustic wave resonator comprising:
a piezoelectric substrate; and
an interdigital transducer electrode provided on the piezoelectric substrate; wherein
the interdigital transducer electrode is apodization weighted such that at least one of a pair of envelopes located at outer side portions of the interdigital transducer electrode in directions substantially perpendicular to acoustic wave propagation directions for the apodization weighting includes a plurality of angled envelope portions, the angled envelope portions being angled so as to extend from an approximate central portion of the interdigital transducer electrode toward an outer side portion of the interdigital transducer electrode in a direction substantially perpendicular to the acoustic wave propagation directions, as the angled envelope portions extend in one of the acoustic wave propagation directions; and
an aspect ration r expressed as a/b=r is at least 0.08, where a number of electrodes fingers of the interdigital transducer electrode is b and a normalized cross width of the electrode fingers of the interdigital transducer electrode is a.

7. The acoustic wave resonator according to claim 6, wherein the angled envelope portions have a substantially straight-line shape.

8. The acoustic wave resonator according to claim 6, wherein the angled envelope portions have a substantially curved shape.

9. An acoustic wave resonator comprising:
a piezoelectric substrate; and
an interdigital transducer electrode provided on the piezoelectric substrate;
wherein
the interdigital transducer electrode is apodization weighted such that at least one of a pair of envelopes located t outer side portions of the interdigital transducer electrode in directions substantially perpendicular to acoutstic wave propagation directions for the apodization weighting includes a plurality of angled envelope portions, the angled envelope portions being angled so as to extend from an approximate central portion of the interdigital transducer electrode toward an outer side portion of the interdigital transducer electrode in a direction substantially perpendicular to the acoustic wave propagation directions, as the angled envelope portions extend in one of the acoustic wave propagation directions; and
a cross width at least one end portion of the interdigital transducer electrode in the acoustic wave propagation directions is not more than about 50 percent of a maximum cross width.

10. The acoustic wave resonator according to claim 6, wherein a surface acoustic wave is used as the acoustic wave.

11. The acoustic wave resonator according to claim 10, wherein one of a Rayleigh wave and a Love wave is used as the surface acoustic wave.

12. The acoustic wave resonator according to claim 6, wherein the acoustic wave resonator is a one-port acoustic wave resonator.

13. The acoustic wave resonator according to claim 4, wherein a surface acoustic wave is used as the acoustic wave.

14. The acoustic wave resonator according to claim 13, wherein one of a Rayleigh wave and a Love wave is used as the surface acoustic wave.

15. The acoustic wave resonator according to claim 4, wherein the acoustic wave resonator is a one-port acoustic wave resonator.

16. The acoustic wave resonator according to claim 9, wherein the angled envelope portions have a substantially straight-line shape.

17. The acoustic wave resonator according to claim 9, wherein the angled envelope portions have a substantially curved shape.

18. The acoustic wave resonator according to claim 9, wherein a surface acoustic wave is used as the acoustic wave.

19. The acoustic wave resonator according to claim 18, wherein one of a Rayleigh wave and a Love wave is used as the surface acoustic wave.

20. The acoustic wave resonator according to claim 9, wherein the acoustic wave resonator is a one-port acoustic wave resonator.

* * * * *